United States Patent [19]

Munter

[11] 4,155,070

[45] May 15, 1979

[54] CODE-CONVERTER WITH PRESERVATION OF PARITY

[75] Inventor: Ernst A. Munter, Ottawa, Canada

[73] Assignee: Northern Telecom Limited, Montreal, Canada

[21] Appl. No.: 856,236

[22] Filed: Dec. 1, 1977

[51] Int. Cl.² .................... G06F 11/10; H03K 13/34
[52] U.S. Cl. .................. 340/146.1 AG; 340/347 DD
[58] Field of Search .......... 340/146.1 AG, 146.1 AQ, 340/347 DD

[56] References Cited

U.S. PATENT DOCUMENTS

| 3,622,981 | 11/1971 | Greenbaum | 340/146.1 AG |
| 3,860,908 | 1/1975 | Stratton | 340/146.1 AG |

OTHER PUBLICATIONS

Swenson et al., "Parity Flow Shifter", *IBM Technical Disclosure Bulletin*, vol. 4, No. 4, Sep. 1961, pp. 14–16.
Tarolli, "Shift Instruction Parity Predicts", *IBM Tech. Disclosure Bulletin*, vol. 18, No. 7, Dec. 1975, pp. 2165–2166.
Beacom et al., "Parity Predict for Incrementer/Decrementer", *IBM Tech. Disclosure Bulletin*, vol. 19, No. 6, Nov. 1976, pp. 2215–2216.

*Primary Examiner*—David H. Malzahn
*Attorney, Agent, or Firm*—Frank Turpin

[57] ABSTRACT

The invention provides a circuit for converting M-bits of an input data word having M+A bits in addition to an input parity bit, to B-bits of an output data word having B+A bits in addition to an output parity bit. A code-conversion circuit is responsive to the input M-bits for generating a converted data word having B-bits plus a secondary parity bit which gives the converted data word a parity value the same as that of the input M-bits. The secondary parity bit is exclusive-ORRED with the input parity bit to produce an output parity bit which renders the parity value of the output data word the same as that of the input data word.

5 Claims, 1 Drawing Figure

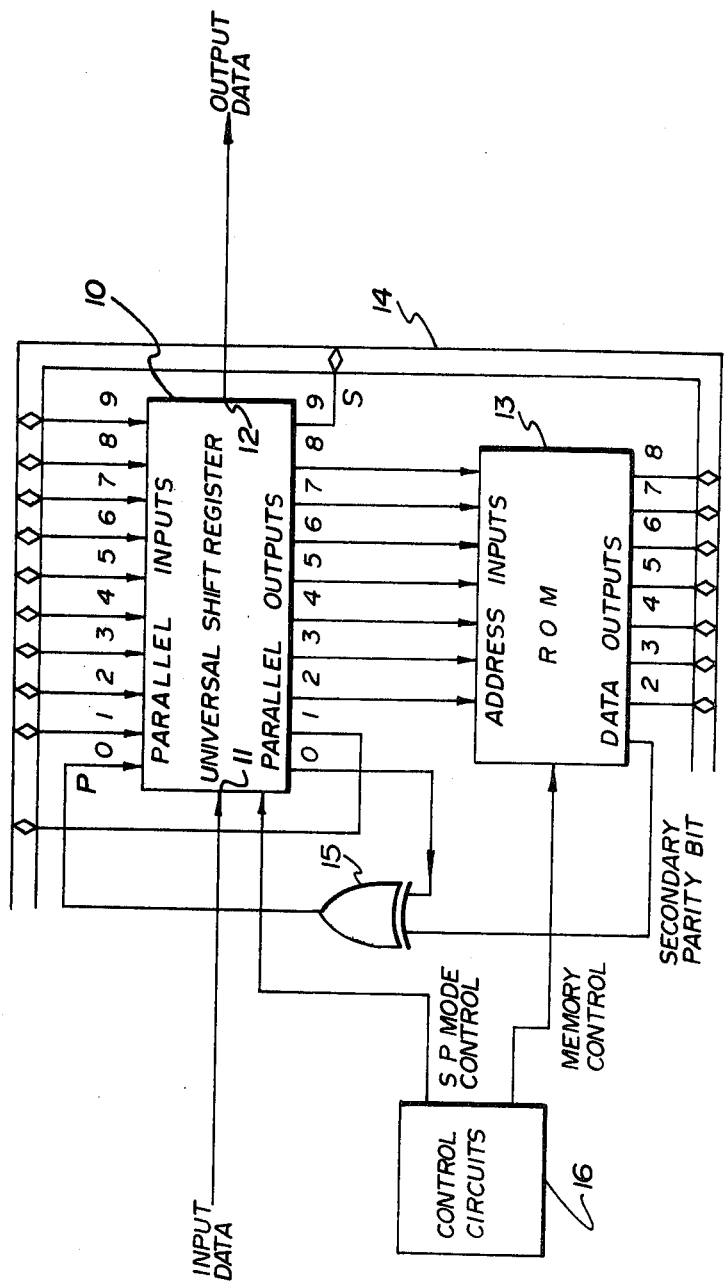

CODE-CONVERTER WITH PRESERVATION OF PARITY

The invention relates generally to code converters and more particularly to a partial code converter with preservation of parity.

The contemporary switching systems use pulse code modulation (PCM) techniques, and in the transmission of data within such systems it is often required that a portion of a data word be converted to different data to achieve either attenuation or amplification of the signal represented by the data. For example, such a converter circuit is described in U.S. Pat. No. 4,021,652 issued to E. Munter and assigned to applicant's assignee.

The above-mentioned patent describes a digital attenuator/amplifier circuit for PCM signals. A memory is loaded with PCM code words corresponding to a unit of attenuation or amplification and each word location in memory corresponds to a predetermined one of the possible PCM code words. The memory is addressed by input PCM code words which cause their corresponding attenuated or amplified words to be read out. By cycling an input PCM word through the memory a predetermined number of times, an incrementally adjustable digital attenuator/amplifier is achieved.

In a digital system such as a telephone switching system the data words being transmitted are usually not pure PCM words. Each data word may comprise a PCM sample word including a sign bit in addition to at least one control or supervisory bit as well as a parity bit. Therefore, the data words in such a system may be at least ten bits wide. Whenever it is required to pass such a word through an attenuator circuit such as described above, only the seven-bit PCM sample portion of the word is converted to a different one; the sign, supervisory and parity bits are simply made to bypass the attenuator circuit. However, since the attenuator circuit is essentially a code-converter, the parity bit ceases to be representative of the parity value of the entire word. In order to regain the parity value of the data word, it is necessary to pass the entire word through a parity generation circuit. Conventionally, these circuits contain a plurality of logic gates and these tend to be fairly expensive.

Therefore, it is the purpose of this invention to provide a code-converter circuit, of the type which uses a memory, with a simple and economical means of preserving the parity value of a data word passed therethrough.

In accordance with the invention, each location of the code-converter memory is provided with one extra bit which maintains the parity value of the PCM sample at that location relative the address thereof. In other words, this secondary parity bit maintains the even or odd parity value of those bits (the address PCM sample) which are changed in the code-converter. The secondary parity bit is exclusive-ORRED with the input parity bit and the output of the exclusive-OR gate is a parity bit which renders the parity value of the output data word the same as that of the input data word. Therefore, the parity value of a data word passed through a code-converter is maintained at the output thereof by using a single logic gate.

An example embodiment of the invention will now be described in conjunction with the drawing which is a logical block diagram of a code-converter in accordance with the invention.

As discussed above, a data word in a telephone system which uses pulse code modulation (PCM) techniques often comprises more bits than are required for the voice samples, e.g. companded PCM. For the purpose of describing the embodiment of the invention, a data word will be assumed to consist of a seven-bit companded PCM code word (bits 2–8), a sign bit (bit 9), a control or supervisory bit (bit 1), and a parity bit (bit 0) — a total of ten bits.

As illustrated in the drawing, a universal shift register 10 has a serial input 11 connected to a source of serial input data words, and a serial output 12 for providing serial output data words. The register 12 may be of the type described in the aforementioned Munter patent. It has the capability of inputting serial or parallel data and of outputting corresponding parallel or serial data.

A read-only-memory (ROM) 13 has a capacity of 128×8 bits wide. The 128 locations of the ROM 13 correspond to respective possible combinations of bits 2 to 8 which serve as the address generator for the memory. Each location in memory is provided with an additional bit which is a secondary parity bit. Since both the address bits and the corresponding memory location bits are known, the secondary parity bit at any one location in memory is chosen to be such that it lends to the data word at that location, a parity value the same as that of the address bits for that location. For example, if the address for a memory location comprises an odd number of ONE bits and the corresponding memory location contains an even number of ONE bits, then the secondary parity bit for that location is chosen to be a ONE bit. Conversely, if the address for a location comprises an even number of ONE bits and the corresponding memory location contains an odd number of ONE bits, then the secondary parity bit for that location is chosen to be ONE bit. If, on the other hand, both the address and the corresponding memory location have an even or odd number of ONE bits, then the secondary parity bit is chosen to be a ZERO bit. The data outputs of the ROM 13 are connected, via a bus 14, back to the parallel inputs of the register 10. Also, the sign bit output (bit 9) and the supervisory information bit output (bit 1) of the shift register 10 are connected to their respective parallel inputs of the register 10 via the bus 14.

An exclusive-OR gate 15 has a first input connected to the parity bit output (bit 0) of the register 10 and a second input connected to the secondary parity bit output of the ROM 13. The output of gate 15 is connected to the parity bit parallel input of the register 10. The operation of the shift register 10 and the memory 13 is controlled by control circuits 16 which provide S/P mode control signals to the register 10 and enabling signals to the memory 13.

DESCRIPTION OF OPERATION

The circuit will be described by following the conversion process of an input data word through the converter. For the purpose of this description, it is assumed that the PCM system in which the code-converter operates uses an even parity value, that is, that the parity bit for any one data word is always chosen so that the data word contains an even number of one bits.

Let us assume that the following input data word appears at the serial input of the shift register 10 which converts the data word to the parallel form:

| positions | 0 | 1 | 2 | 3 | 4 | 5 | 6 | 7 | 8 | 9 |
|---|---|---|---|---|---|---|---|---|---|---|
| BITS | 1 | 1 | 1 | 0 | 1 | 1 | 0 | 1 | 0 | 0 |

Bits 2–8 form the address for the memory 13 which is enabled by the control circuits 16. The memory 13 outputs the binary word 1101110 found at the memory location 1011010, as well as a secondary parity bit. Because the address 1011010 comprises an even number of ONE bits and the corresponding memory location contains an odd number of ONE bits, the secondary parity bit at that location had been chosen to be a ONE bit. The output data from the memory 13 as well as the sign and supervisory bits appear at the parallel inputs of the register 10 via the bus 14. The gate 15 produces the exclusive-OR function of the secondary parity bit (ONE) and the input parity bit (ONE) to produce the output parity bit (ZERO). The register 10 is controlled to accept the data at its parallel inputs and to output the data word serially via the terminal 12. Thus the output data word (0111011100) consists of the converted data bits (bits 2–8), the sign and supervisory bits (bits 9 and 1 respectively) which were unchanged by the code-converter and the parity bit (bit 0) which was changed in order to maintain the parity value (even parity) of the input data word in the output data word. Hence, in a code-converter which uses a memory, the invention provides a means of preserving the parity value of a data word through the conversion process using a single logic gate.

The code-converter may of course be of many types. For example, it may be of the type which comprises a code conversion memory for producing attenuation or amplification of a signal such as that described in the aforementioned patent or it may be of the type which comprises a code conversion circuit for translating data. The circuit of the example embodiment comprises a 128 word memory; however, it should be realized that the memory may be of a much larger size. For example a 1024×8 bit memory which is available as an off-the-shelf component may be partitioned as an eight-page memory, each page being a 128×8 bit memory and each page being individually addressable.

What is claimed is:

1. A circuit for converting M-bits of an input data word having M+A bits in addition to an input parity bit having a predetermined parity value, to B-bits of an output data word having B+A bits in addition to an output parity bit, comprising:
   a code conversion circuit responsive to the input M-bits for generating a converted data word having B-bits plus a secondary parity bit which gives the converted data word a parity value the same as that of the input M-bits; and
   means for exclusive-ORING the input parity bit and the secondary parity bit to produce an output parity bit, whereby the output data word comprises the A and B bits in addition to the output parity bit which gives the output data word a parity value which is the same as that of the first data word.

2. A code-converter as defined in claim 1 wherein the code conversion circuit comprises a memory means having a plurality of locations each one having an address corresponding to a respective combination of the input M-bits and each location having a converted data word comprising B-bits plus a secondary parity bit which gives the converted data word a parity value which is the same as that of the input M-bits forming the address for that location.

3. A code-converter as defined in claim 2 wherein the memory means is a read-only-memory.

4. A code-converter circuit for converting M-bits of a serial input data word having M+A bits in addition to an input parity bit having a predetermined parity value, to B-bits of a serial output data word having B+A bits in addition to an output parity bit, comprising:
   an interface circuit adapted to selectively receive serial and parallel data and to selectively output serial and parallel data;
   memory means having a plurality of locations each one having an address corresponding to a respective combination of the input M-bits and each location having a converted data word comprising B-bits plus a secondary parity bit which gives the converted data word a parity value which is the same as that of the input M-bits forming the address for that location;
   control means for effecting the loading of said interface circuit with a serial data word and for enabling the memory means to be addressed at the location defined by the M-bits of the data word;
   an exclusive-OR gate responsive to the input parity bit and the secondary parity bit from the memory means to produce an output parity bit; and
   means for feeding back to the parallel inputs of the interface circuit the output data word which comprises the A-bits from the output of the interface circuit, the B-bits from the output of the memory means and the output parity bit which gives the output data word a parity value which is the same as that of the input data word.

5. In a code-converter for converting M-bits of an input data word having M+A bits in addition to an input parity bit, to B-bits of an output data word having B+A bits in addition to an output parity bit, the code-converter comprising a memory means having a plurality of locations each one having an address corresponding to a respective combination of the input M-bits and each location having a converted data word comprising B-bits plus a secondary parity bit which gives the converted data word a parity value which is the same as that of the input M-bits forming the address for that location, a method for maintaining the parity value of the input data word in the output data word, comprising the steps of:
   enabling the memory means to be addressed at the location defined by the M-bits of a first data word to cause the memory means to output the B-bits at that location in addition to the secondary parity bit associated therewith;
   exclusive-ORING the input parity bit and the secondary parity bit to generate an output parity bit, thereby giving the output data word a parity value which is the same as that of the input data word.

* * * * *